(12) United States Patent
Liu et al.

(10) Patent No.: US 10,510,866 B1
(45) Date of Patent: Dec. 17, 2019

(54) SEMICONDUCTOR STRUCTURE AND FABRICATION METHOD THEREOF

(71) Applicant: TAIWAN SEMICONDUCTOR MANUFACTURING CO., LTD., Hsinchu (TW)

(72) Inventors: Kuo-An Liu, Hsinchu (TW); Chan-Lon Yang, Taipei (TW); Bharath Kumar Pulicherla, Hsinchu (TW); Zhi-Qiang Wu, Hsinchu County (TW); Chung-Cheng Wu, Hsinchu County (TW); Chih-Han Lin, Hsinchu (TW); Gwan-Sin Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/007,885

(22) Filed: Jun. 13, 2018

(51) Int. Cl.
| H01L 29/66 | (2006.01) |
| H01L 27/08 | (2006.01) |
| H01L 21/02 | (2006.01) |
| H01L 27/088 | (2006.01) |
| H01L 29/423 | (2006.01) |
| H01L 21/8234 | (2006.01) |

(Continued)

(52) U.S. Cl.
CPC .... *H01L 29/66545* (2013.01); *H01L 21/0228* (2013.01); *H01L 21/31111* (2013.01); *H01L 21/32133* (2013.01); *H01L 21/32139* (2013.01); *H01L 21/823431* (2013.01); *H01L 21/823437* (2013.01); *H01L 21/823468* (2013.01); *H01L 27/0886* (2013.01); *H01L 29/42372* (2013.01)

(58) Field of Classification Search
CPC ... H01L 29/66; H01L 29/665; H01L 29/6654; H01L 29/66545; H01L 29/42; H01L 29/423; H01L 29/4237; H01L 29/42372; H01L 27/08; H01L 27/086; H01L 27/0886; H01L 21/02; H01L 21/08; H01L 21/31; H01L 21/32; H01L 21/82
USPC ........................................................ 257/401
See application file for complete search history.

(56) References Cited

U.S. PATENT DOCUMENTS

| 9,805,985 | B2 * | 10/2017 | Liaw | ..................... H01L 27/088 |
| 2013/0200450 | A1 * | 8/2013 | Kusai | ................ H01L 29/66833 |
| | | | | 257/324 |

OTHER PUBLICATIONS

Inayoshi, M., et al., "Surface reaction of CF2 radicals for fluorocarbon film formation in SiO2/Si selective etching process," Journal of Vacuum Science & Technology A:Vacuum, Surfaces, and Films, vol. 16, Issue 1, pp. 233-238 (1998).

(Continued)

*Primary Examiner* — Monica D Harrison
(74) *Attorney, Agent, or Firm* — Maschoff Brennan

(57) ABSTRACT

A semiconductor structure is disclosed that includes the fin structure and the plurality of gates. The plurality of gates disposed with respect to the fin structure and including the first gate, the second gate, and the third gate. The spacing between the first gate and the second gate is smaller than the spacing between the second gate and the third gate. The second gate is disposed between the first gate and the third gate. The foot portion of the first gate, facing the second gate, and the first foot portion of the second gate, facing the first gate, have no lateral extension. The second foot portion of the second gate, facing the third gate, and the foot portion of the third gate, facing the second gate, have no lateral extension and/or cut.

20 Claims, 6 Drawing Sheets

(51) Int. Cl.
*H01L 21/3213* (2006.01)
*H01L 21/311* (2006.01)

(56) References Cited

OTHER PUBLICATIONS

Zhang, D and Kushner, M.J., "Investigations of surface reactions during C2F6 plasma etching of SiO2 with equipment and feature scale models,", Journal of Vacuum Science & Technology A: Vacuum, Surfaces, and Films, vol. 19, Issue 2, pp. 524-538 (2001).

* cited by examiner

SEMICONDUCTOR STRUCTURE AND FABRICATION METHOD THEREOF

BACKGROUND

A conventional fabrication process employed in manufacturing semiconductor devices is a gate etching process that is used to form, for example, polysilicon gate, which is typically utilized for a transistor. This gate etching process is essential with regard to device operation and critical dimensions. Various control of the etching process results in benefits, including, for example, enhanced device characteristics, improved device performance, improved device yield, and so on. Thus, an accurate and precise gate etching process used to form desired gate profiles is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
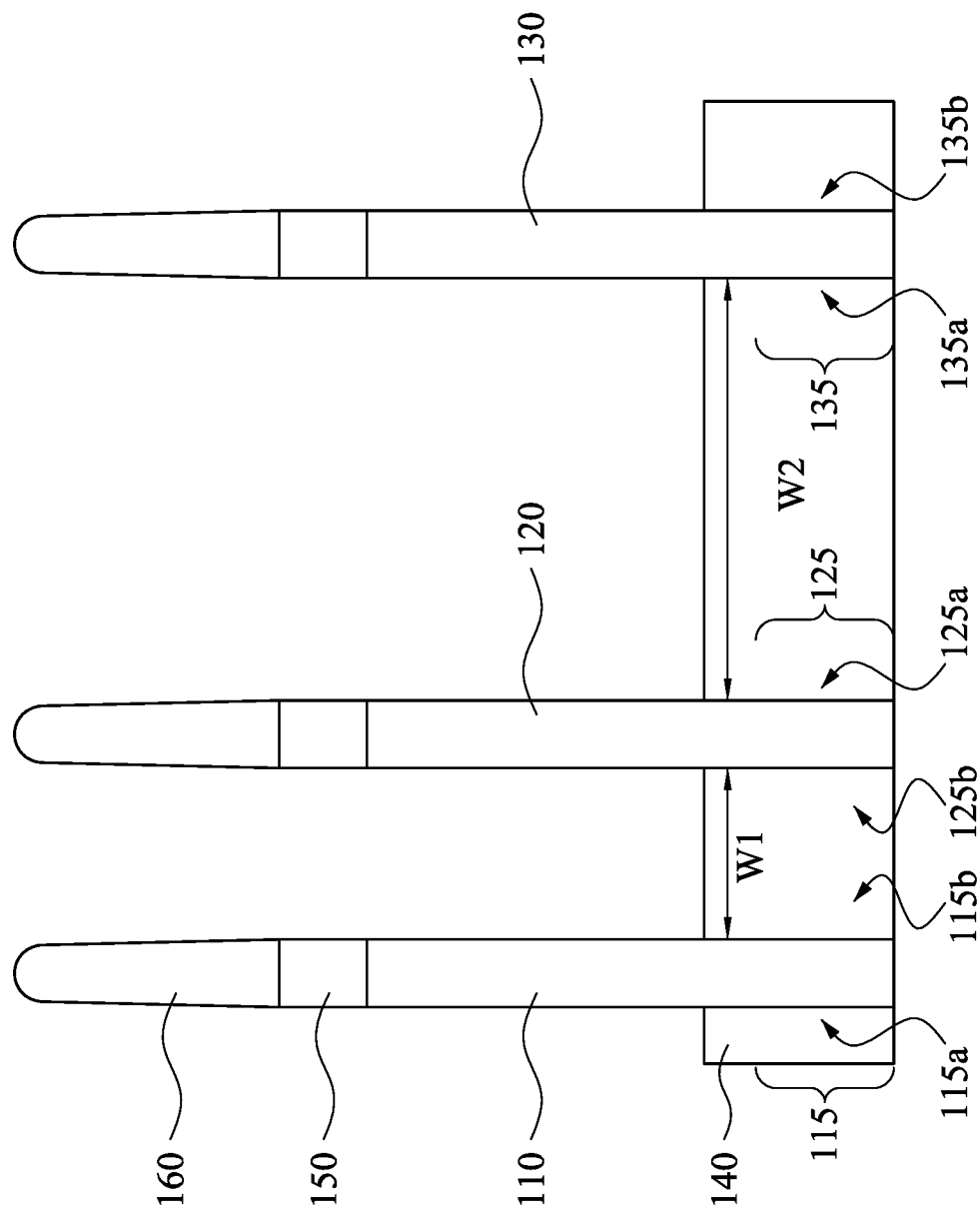
FIG. 1 shows a schematic diagram of a semiconductor structure 100, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is made to FIG. 1. FIG. 1 is a schematic diagram of a semiconductor structure 100, according to some embodiments of the present disclosure. The semiconductor structure 100 includes a first gate 110, a second gate 120, and a third gate 130 that are disposed with respect to a fin structure 140.

For convenience of discussion, FIG. 1 illustrates one first gate 110, one second gate 120, one third gate 130, and one fin structure 140. The amounts of the first gate 110, the second gate 120, the third gate 130, and the fin structure 140 in FIG. 1 are given for illustrative purposes. Various amounts of the first gate 110, the second gate 120, the third gate 130, and the fin structure 140 are within the contemplated scope of the present disclosure.

In some embodiments, the first gate 110, the second gate 120, and the third gate 130 are disposed over the fin structure 140. For illustration in FIG. 1, the first gate 110, the second gate 120, and the third gate 130 are disposed in parallel over the fin structure 140. The second gate 120 is disposed between the first gate 110 and the third gate 130.

In some embodiments, the first gate 110 and the second gate 120 have a spacing W1 therebetween, and the second gate 120 and the third gate 130 have a spacing W2 therebetween. In some embodiments, the spacing W1 is smaller than the spacing W2. In some embodiments, the spacing W1 is approximately smaller than 40 nm (nanometers), and accordingly, the region between the first gate 110 and the second gate is also referred to as a "dense region" or a "device region" in some embodiments. In some embodiments, the spacing W2 is approximately larger than 60 nm, and accordingly, the region between the second gate 120 and the third gate 130 is also referred to as an "iso region" or a "peripheral region".

In some embodiments, the first gate 110, the second gate 120, and the third gate 130 are polysilicon gates. In some other embodiments, the first gate 110, the second gate 120, and the third gate 130 are metal gates. In some embodiments, the materials of the first gate 110, the second gate 120, and the third gate 130 are the same. In some other embodiments, the materials of the first gate 110, the second gate 120, and the third gate 130 are partially the same or different from each other.

In some embodiments, the first gate 110, the second gate 120, and the third gate 130 are dummy polysilicon gates. Types of the first gate 110, the second gate 120, and the third gate 130 are given for illustrative purposes. Various types of the first gate 110, the second gate 120, and the third gate 130 are within the contemplated scope of the present disclosure.

The fin structure 140 is able to be formed by suitable methods. For illustration, the fin structure 140 is formed using one or more photolithography processes, including, for example, double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to perform a patterning process to form the fin structure 140.

In some embodiments, the semiconductor structure 100 further includes a first mask 150 and a second mask 160. For illustration in FIG. 1, the first mask 150 is disposed above the first gate 110, the second gate 120, and the third gate 130. The second mask 160 is disposed above the first mask 150. In some embodiments, the first mask 150 and the second mask 160 are hard masks. In some embodiments, the first mask 150 and the second mask 160 are made of silicon nitride (SiN). The above material of the first mask 150 and the second mask 160 is given for illustrative purposes. Various materials of the first mask 150 and the second mask 160 are within the contemplated scope of the present disclosure.

In some other embodiments, the first mask 150 and the second mask 160 are removed from the semiconductor structure 100. Alternatively stated, a final product including the semiconductor structure 100 does not include the first mask 150 and the second mask 160.

In some embodiments, the first gate 110 has no lateral extension and/or cut facing the second gate 120 with respect to the fin structure 140. For illustration in FIG. 1, a side wall of the first gate 110 facing the second gate 120 has a vertical profile with respect to the fin structure 140.

In some embodiments, the first gate 110 includes a foot portion 115 as illustrated in FIG. 1. For illustration, the foot portion 115 includes a side wall 115a and a side wall 115b that is opposite to the side wall 115a and faces the second gate 120. The side wall 115a and the side wall 115b are both vertical with respect to the fin structure 140.

In some embodiments, the second gate 120 has no lateral extension and/or cut facing the first gate 110 and the third gate 130 with respect to the fin structure 140. For illustration in FIG. 1, a side wall of the second gate 120 facing the first gate 110 has a vertical profile with respect to the fin structure 140, and a side wall of the second gate 120 facing the third gate 130 has a vertical profile with respect to, for illustration, the fin structure 140.

In some embodiments, the second gate 120 includes a foot portion 125 as illustrated in FIG. 1. For illustration, the foot portion 125 includes a side wall 125a that faces the first gate 110, and a side wall 125b that is opposite to the side wall 125a and faces the third gate 130. The side wall 125a and the side wall 125b are both vertical with respect to, for illustration, the fin structure 140.

In some embodiments, the third gate 130 has no lateral extension and/or cut facing the second gate 120 with respect to the fin structure 140. For illustration in FIG. 1, a side wall of the third gate 130 facing the second gate 120 has a vertical profile with respect to, for illustration, the fin structure 140.

In some embodiments, the third gate 130 includes a foot portion 135 as illustrated in FIG. 1. For illustration, the foot portion 135 includes a side wall 135a that faces the second gate 120, and a side wall 135b that is opposite to the side wall 135a. The side wall 135a and the side wall 135b are both vertical with respect to, for illustration, the fin structure 140.

In some embodiments as discussed above with respect to the dense region and the iso region, the foot portions of the gates located at the dense region, including, for example, the first gate 110 and the second gate 120, have side walls vertical to the fin structure 140, and the foot portions of the gates located at the iso region, including, for example, the second gate 120 and the third gate 130, have side walls vertical to the fin structure 140.

In the embodiments as discussed above, the physical profiles of the first gate 110, the second gate 120, and the third gate 130 are identical. The above physical profiles are given for illustrative purposes. Various physical profiles of the first gate 110, the second gate 120, and the third gate 130 are within the contemplated scope of the present disclosure. For example, in various embodiments, the foot portion 135 of the third gate 130 is different from the foot portion 115 of the first gate 110 and the foot portion 125 of the second gate 120, which will be discussed below with reference to FIG. 6.

The above configuration of the semiconductor structure 100 is given for illustrative purposes. Various configurations of the semiconductor structure 100 are within the contemplated scope of the present disclosure.

Figure 2:
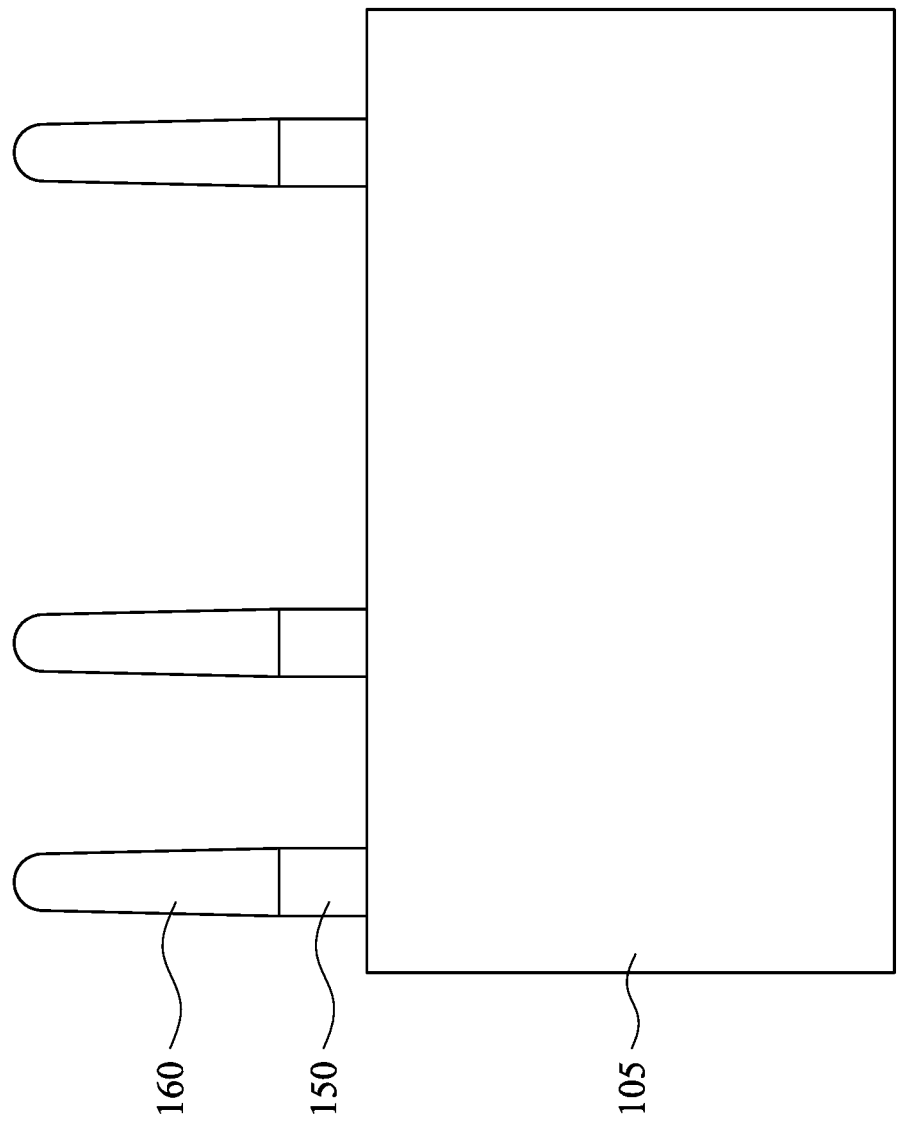
FIGS. 2-4 are diagrams illustrating processes of manufacturing the semiconductor structure 100 in FIG. 1, according to some embodiments of the present disclosure.
Figure 3:
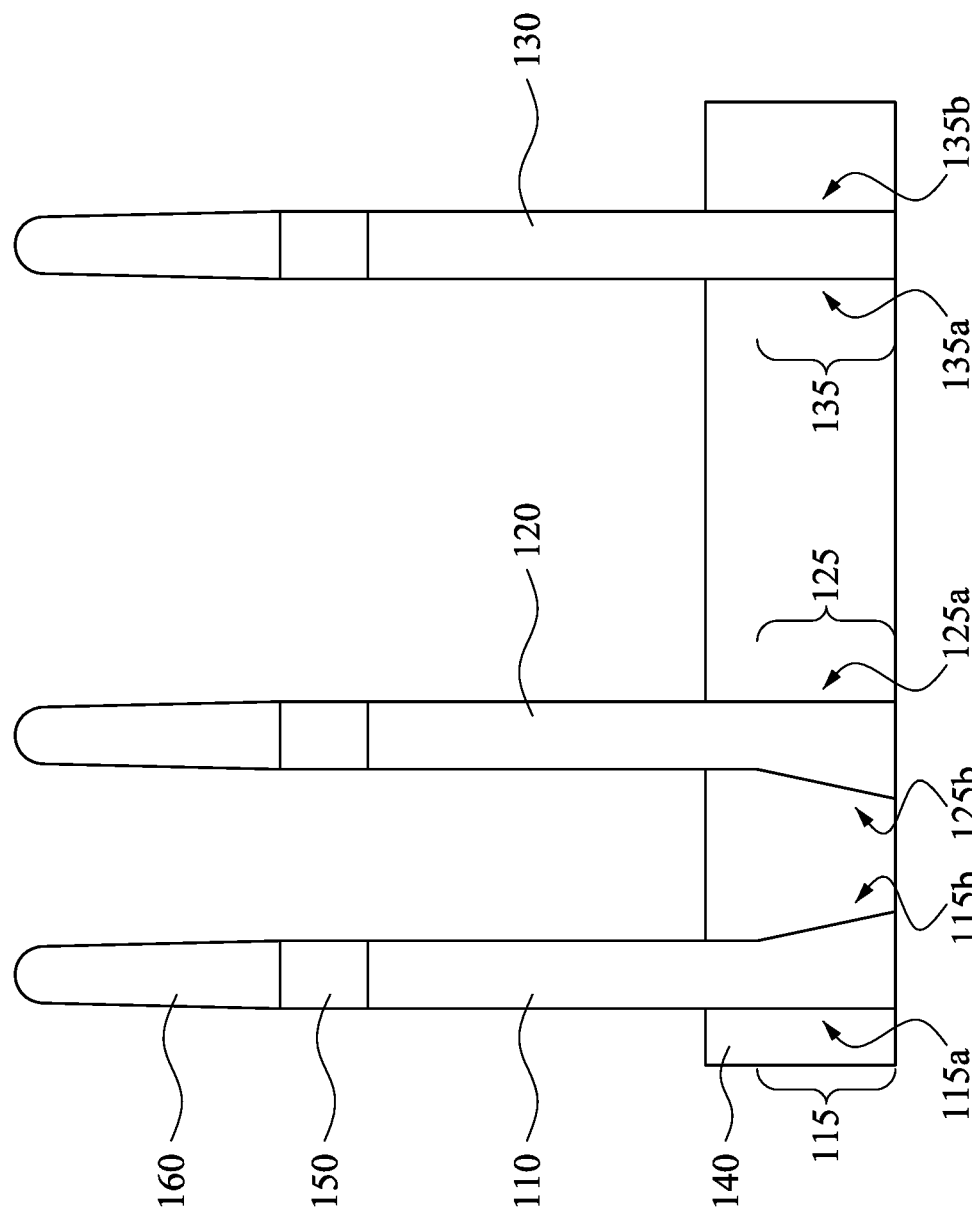
Figure 4:
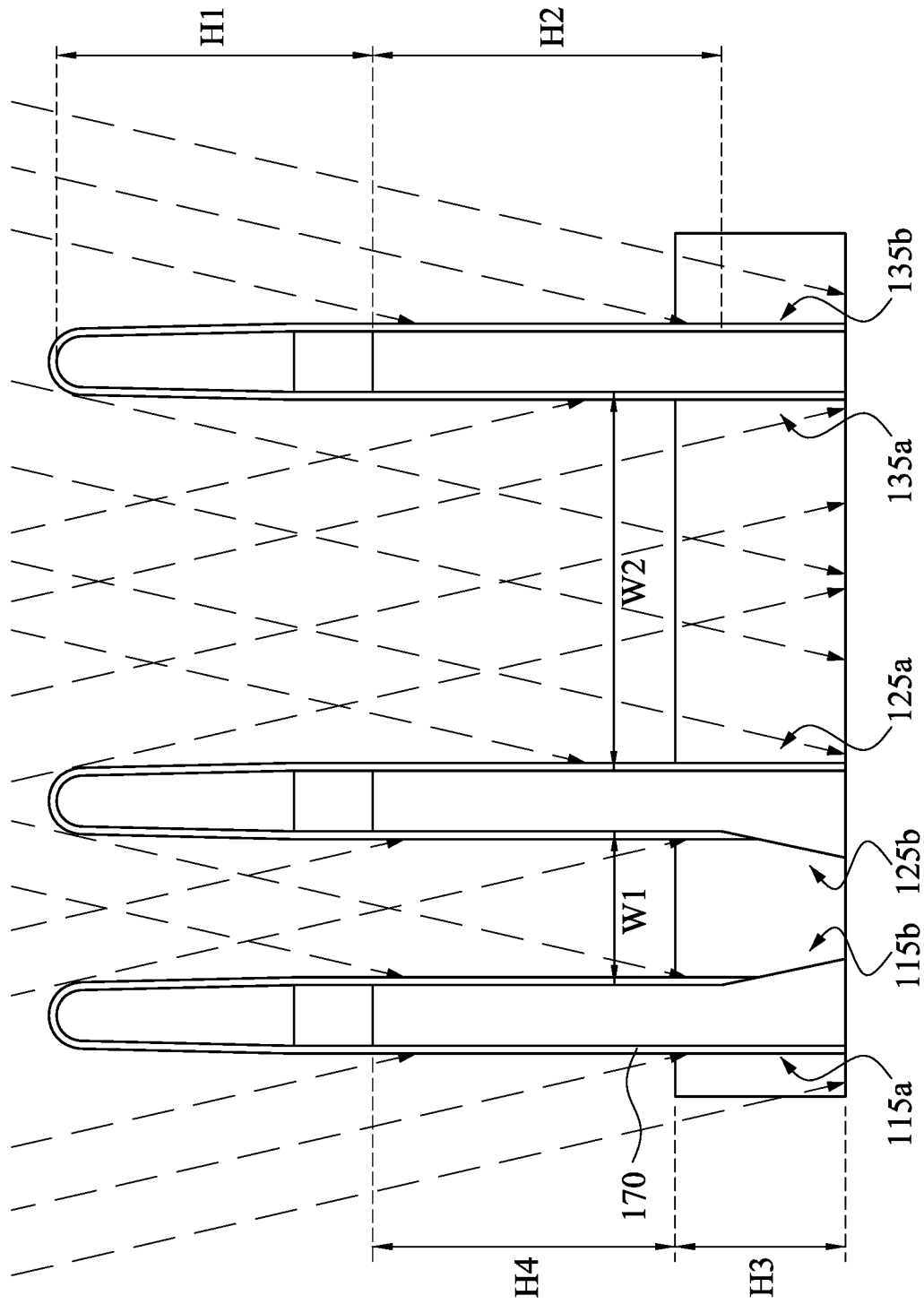

FIGS. 2-4 are diagrams illustrating processes of manufacturing the semiconductor structure 100 in FIG. 1, according to some embodiments of the present disclosure. With respect to the embodiments of FIG. 1, like elements in FIGS. 2-4 are designated with the same reference numbers for ease of understanding. For simplicity, some reference numbers shown in FIG. 1 are not shown in FIGS. 2-4. The processes of manufacturing the semiconductor structure 100 in FIGS. 2-4 are given for illustrative purposes. Various processes of manufacturing the semiconductor structure 100, which are not shown in FIGS. 2-4, are within the contemplated scope of the present disclosure.

Figure 5:
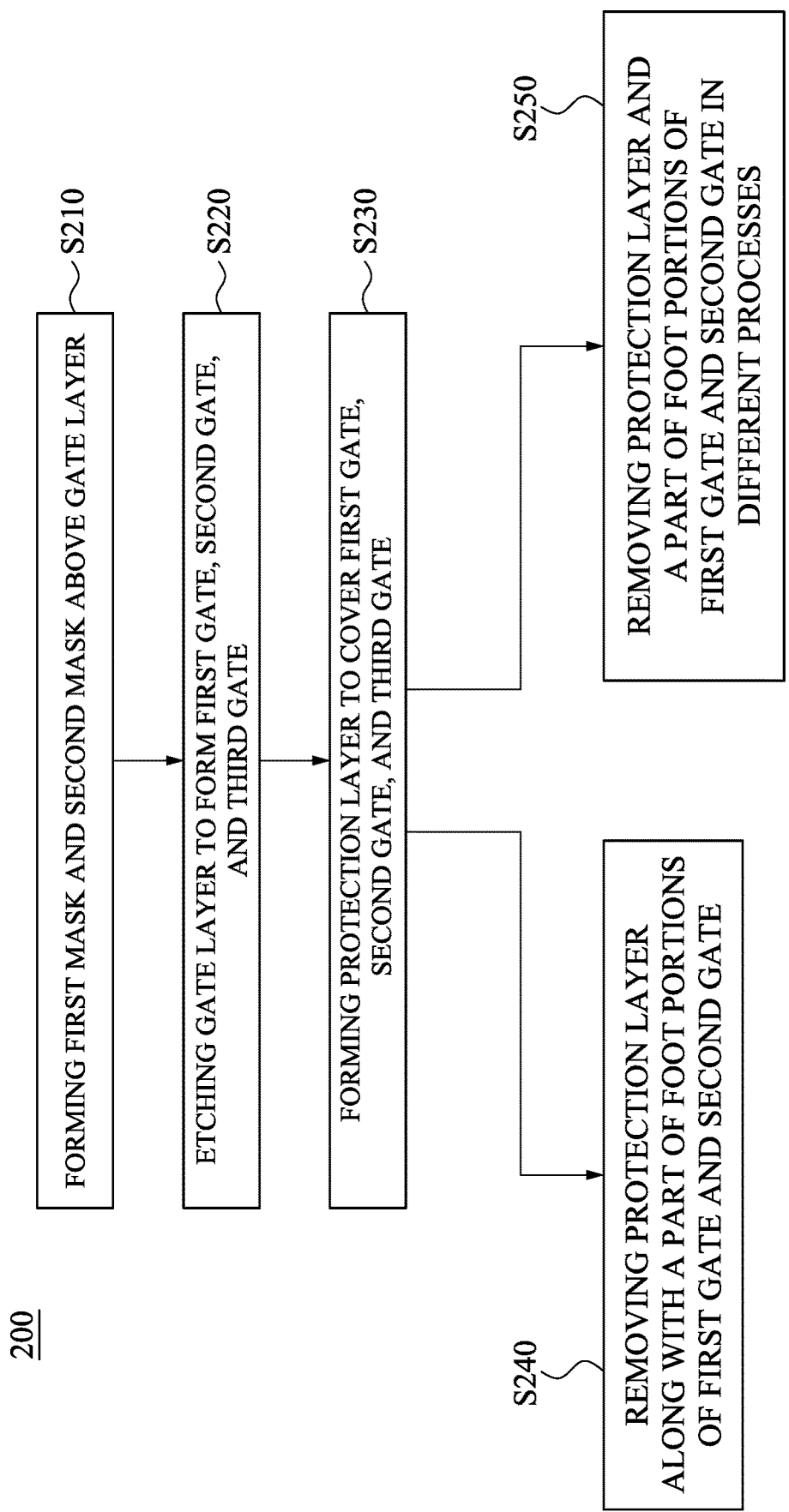
FIG. 5 is a flow chart of a method 200 for manufacturing the semiconductor structure 100 in FIG. 1, according to some embodiments of the present disclosure.

FIG. 5 is a flow chart of a method 200 for manufacturing the semiconductor structure 100 in FIG. 1, according to some embodiments of the present disclosure. The method 200 includes operations S210, S220, S230, and S240. For ease of understanding, the method 200 in FIG. 5 is explained below with reference to FIGS. 2-4.

In operation S210 of FIG. 5, with reference to FIG. 2, the first mask 150 and the second mask 160 are formed above a gate layer 105. In some embodiments, the gate layer 105 is formed of polysilicon. In some embodiments, the first mask 150 and the second mask 160 are formed by depositing layers over the gate layer 105, and patterning the layers. For illustration in FIG. 2, the first mask 150 and the second mask 160 have the same pattern, and these two masks are formed at the same location.

In operation S220 of FIG. 5, with reference to FIG. 3, the gate layer 105 is etched to form the first gate 110, the second gate 120, and the third gate 130. In this process, the gate layer 105 is first etched after the first mask 150 and the second mask 160 are formed. Accordingly, in the embodiments of the gate layer 105 being formed of polysilicon, this process is also referred to as a "first poly etch" process in some embodiments.

In some embodiments, the gate layer 105 is etched under an anisotropic etching process. In some embodiments in FIG. 3, after the gate layer 105 is etched, the first gate 110 and the second gate 120 are formed, and each one of the first gate 110 and the second gate 120 has a footing shape. For illustration in FIG. 3, the foot portion 115 of the first gate 110 and the foot portion 125 of the second gate 120 have lateral extension when the gate layer 105 is etched to form the first gate 110 and the second gate 120.

For another illustration in FIG. 3, the side wall 115b has a slope with respect to the side wall 115a of the first gate 110, and the side wall 125b has a slope with respect to the side wall 125a of the second gate 120. Alternatively stated, the side wall 115a of the first gate 110 and the side wall 125a of the second gate 120 are vertical with respect to, for illustration, the fin structure 140, and the side wall 115b of the first gate 110 and the side wall 125b of the second gate 120 are not vertical with respect to, for illustration, the fin structure 140.

In some embodiments in FIG. 3, after the gate layer 105 is etched, the third gate 130 is formed, and the third gate 130 has no lateral extension and/or cut. In some other embodiments, the foot portion 135 of the third gate 130 has a vertical profile. For illustration in FIG. 3, the side wall 135a and the side wall 135b that is opposite to the side wall 135a of the third gate 130 are both vertical with respect to, for illustration, the fin structure 140. Alternatively stated, the side wall 135a and the side wall 135b of the third gate 130 are parallel to each other.

In operation S230 of FIG. 5, with reference to FIG. 4, a protection layer 170 is formed to cover the first gate 110, the second gate 120, and the third gate 130 that are formed in operation S220. In some embodiments in FIG. 4, the protection layer 170 does not cover a part of the foot portion 115 of the first gate 110 and a part of the foot portion 125 of the second gate 120. For illustration in FIG. 4, the protection layer 170 does not cover the side wall 115b of the foot portion 115 of the first gate 110 and the side wall 125b of the foot portion 125 of the second gate 120.

In some embodiments, the protection layer 170 is formed under a directional deposition process. In some embodiments, the directional deposition process is performed by directing an ion beam with a tilted angle to the first gate 110, the second gate 120, and the third gate 130 as formed in FIG. 3, in order to deposit the protection layer 170. The arrows with dashed lines in FIG. 4 indicate that the ion beam is incident on the first gate 110, the second gate 120, and the third gate 130 to perform the deposition process.

In some embodiments with respect to the dense region as discussed above, with the shadowing effect, after depositing the protection layer 170 on the first gate 110, the side wall 115a is covered by the protection layer 170, but the side wall 115b is not covered by the protection layer 170. Explained in a different way, according to the incident angle of the ion beam with respect to the first gate 110 and the second gate 120, for illustration in FIG. 4, the side wall 115b is shielded based on the shadowing effect in the dense region as discussed above, and accordingly, there is no protection layer 170 formed on the side wall 115b.

In some embodiments with respect to the dense region as discussed above, with the shadowing effect, after depositing the protection layer 170 on the second gate 120, the side wall 125a is covered by the protection layer 170, but the side wall 125b is not covered by the protection layer 170. Explained in a different way, according to the incident angle of the ion beam with respect to the first gate 110 and the second gate 120, for illustration in FIG. 4, the side wall 125b is shielded based on the shadowing effect in the dense region, and accordingly, there is no protection layer 170 formed on the side wall 125b.

In some embodiments with respect to the iso region as discussed above, after depositing the protection layer 170 on the third gate 130, the side wall 135a and the side wall 135b are both covered by the protection layer 170. Explained in a different way, there is no shadowing effect affecting the deposition on the foot portion 135 of the third gate 130 at the iso region, for illustration in FIG. 4.

In some embodiments, depositing the protection layer 170 is performed by atomic layer deposition (ALD) with ion activation or precursor. The ion activation or precursor is deposited with the incident angle to perform the directional deposition. In some other embodiments, depositing the protection layer 170 is performed by ion induced polymer deposition. For example, Argon ion (Ar+) is used in order to form Ar+ enhanced passivation as the protection layer 170. For illustration, the ions are deposited with the incident angle to perform the directional deposition. In alternative embodiments, depositing the protection layer 170 is performed by ion induced polysilicon oxidation. The semiconductor structure as discussed above is bombarded with ions with the incident angle to perform the directional deposition, and the bombarded part of the gates, including, for illustration, the first gate 110, the second gate 120, and the third gate 130, are to be oxidized. The above depositions to form the protection layer 170 are given for illustrative purposes. Various depositions to form the protection layer 170 are within the contemplated scope of the present disclosure.

For another illustration in FIG. 4, a height H1 indicates a total height of the hard mask which includes, for illustration, the first mask 150 and the second mask 160 as discussed above, and a height H2 indicates the height of the gates which include, for illustration, the first gate 110, the second gate 120, and the third gate 130, above their respective foot portions as discussed above.

For another illustration in FIG. 4, the spacing W1 represents a distance between two immediately adjacent gates, including, for illustration, the first gate 110 and the second gate 120 in the dense region as discussed above. The spacing W2 represents a distance between two immediately adjacent gates, including, for illustration, the second gate 120 and the third gate 130, in the iso region as discussed above. In some embodiments, the incident angle of the ion beam configured to perform the directional deposition is associated with the height H1, the height H2, and the spacing W1. In some other embodiments, the incident angle of the ion beam configured to perform the directional deposition is associated with an aspect ratio AR. The aspect ratio AR is obtained from a following equation (1)

$$AR = \frac{(H1 + H2)}{W1}. \tag{1}$$

In some embodiments, the above incident angle is in a range of approximately −20° and approximately +20°. In some other embodiments, the incident angle of the ion beam with respect to the first gate 110 and the second gate 120 is in a range of approximately 9° and approximately 10°, that is included by the first gate 110 and the direction of the ion beam. In some embodiments, regarding the above angles, 0° is referred to as a normal incidence of the ion beam, and negative and positive signs are referred to as different incidence directions. For illustration, when a positive angle indicates the incidence of the ion beam from left to right on FIG. 4, a negative angle indicates the incidence of the ion beam from right to left on FIG. 4.

In some embodiments, the height H1 is in a range of approximately 90-130 nm. In some embodiments, the height H2 is in a range of approximately 70-130 nm. In some embodiments, the spacing W1 and the spacing W2 are in the ranges as discussed in the embodiments of FIG. 1. In some embodiments, the height H1 is in a range of approximately.

For further illustration in FIG. 4, a height H3 indicates a height of the fin structure 140, and a height H4 indicates a height of each of the first gate 110, the second gate 120, and the third gate 130 above the fin structure 140. In some embodiments, the height H3 is in a range of approximately 40-60 nm. In some embodiments, the height H4 is in a range of approximately 60-120 nm.

In operation S240 of FIG. 5, with reference to FIG. 1, the protection layer 170 as illustrated in FIG. 4 and portions of the first gate 110 and the second gate 120 are removed. In some embodiments, a part of the foot portion 115 of the first gate 110 and the foot portion 125 of the second gate 120, that are not covered by the protection layer 170, are removed along with the protection layer 170, for illustration, in single one process, in order to form the first gate 110, the second gate 120, and the third gate 130 as discussed above in the embodiments of FIG. 1.

In operation S250 of FIG. 5, with reference to FIG. 1, the protection layer 170 as illustration in FIG. 4 and portions of the first gate 110 and the second gate 120 are removed. Comparing to S240, in alternative embodiments, a part of the foot portion 115 of the first gate 110 and the foot portion 125 of the second gate 120, that are not covered by the protection layer 170, are not removed along with the protection layer 170. Alternatively stated, a part of the foot portion 115 of the first gate 110, a part of the foot portion 125 of the second gate 120, and the protection layer 170 are removed in different processes. For illustration, a part of the foot portion 115 of the first gate 110 and a part of the foot portion 125 of the second 120 are removed, and afterwards, the protection layer 170 is removed. Thus, the structure of embodiment shown in FIG. 1 is formed.

For further illustration of FIG. 4, the part of the foot portion 115 corresponding to the side wall 115b is removed. Accordingly, the side wall 115b of the foot portion 115 of the first gate 110 becomes vertical with respect to the fin structure 140 and parallel to the side wall 115a of the foot portion 115 of the first gate 110.

Correspondingly, the part of the foot portion 125 corresponding to the side wall 125b is removed. Accordingly, the side wall 125b of the foot portion 125 of the second gate 120 becomes vertical with respect to the fin structure 140 and parallel to the side wall 125a of the foot portion 125 of the second gate 120.

Any portion of the third gate 130 is not removed at this stage because the third gate 130 is entirely covered by the protection layer 170. Accordingly, after the protection layer 170 is removed, the third gate 130 remains the same.

In some embodiments, the foot portions of the first gate 110 and the second gate 120 are removed under an etching process. This etching process is performed after the "first poly etch" process as discussed above. Accordingly, in the embodiments of the gate layer 105 being formed of polysilicon, this etching process is also referred to as a "second poly etch" process. As discussed above, this etching process is performed to remove the foot portions of the first gate 110 and the second gate 120, and accordingly, this etching process is also referred to as a "de-footing" process in some embodiments. The above processes of removing a part of the foot portions of the first gate 110 and the second gate 120 are given for illustrative purposes. Various processes of removing a part of the foot portions of the first gate 110 and the second gate 120 are within the contemplated scope of the present disclosure.

In some embodiments, the above process of etching the foot portions of the first gate 110 and the second gate 120 is a wet etching, gas phase etching, plasma etching, remote plasma etching, and/or isotropic etching process. The process of etching the foot portions of the first gate 110 and the second gate 120 is given for illustrative purposes. Various processes of etching the foot portions of the first gate 110 and the second gate 120 are within the contemplated scope of the present disclosure.

In some embodiments, a hydrofluoric acid (dilute HF) solution is used during the process of removing the protection layer 170. The above etchant used to remove the protection layer 170 is given for illustrative purposes. Various etchants used to remove the protection layer 170 are within the contemplated scope of the present disclosure.

In some approaches, when gates in the dense region as discussed above are etched in order to have foot portions with vertical profiles, gates in the iso region as discussed above are over etched in the same process. Accordingly, the gates in the iso region do not have foot portions with vertical profiles and would have unnecessary cuts.

Compared to the above approaches, in the embodiments of the present disclosure, the protection layer 170 is formed to cover the desired foot portions of the gates in the dense region by, for illustration, the directional deposition. Accordingly, foot portions of the gates in both of the dense region and the iso region have vertical profiles. Moreover, with covering the desired foot portions of the gates by the protection layer 170, an isotropic etching process with, for example, low ion energy, is able to be performed. Accordingly, loss of fin structure, which occurs during the etching process, is able to be prevented.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in various embodiments, in addition to the operations in FIG. 5, after the protection layer 170 is removed, the first hard mask 150 and the second hard mask 150 are removed.

The above configuration of the semiconductor structure 100 is given for illustrative purposes. Various configurations of the semiconductor structure 100 are with the contemplated scope of the present disclosure. For example, in various embodiments, there are more gates disposed between the first gate 110 and the second gate 120. For another example, in alternative embodiments, the foot portions of the first gate 110 and the second gate 120 have various configurations, which are discussed below with reference to FIG. 6.

Figure 6:
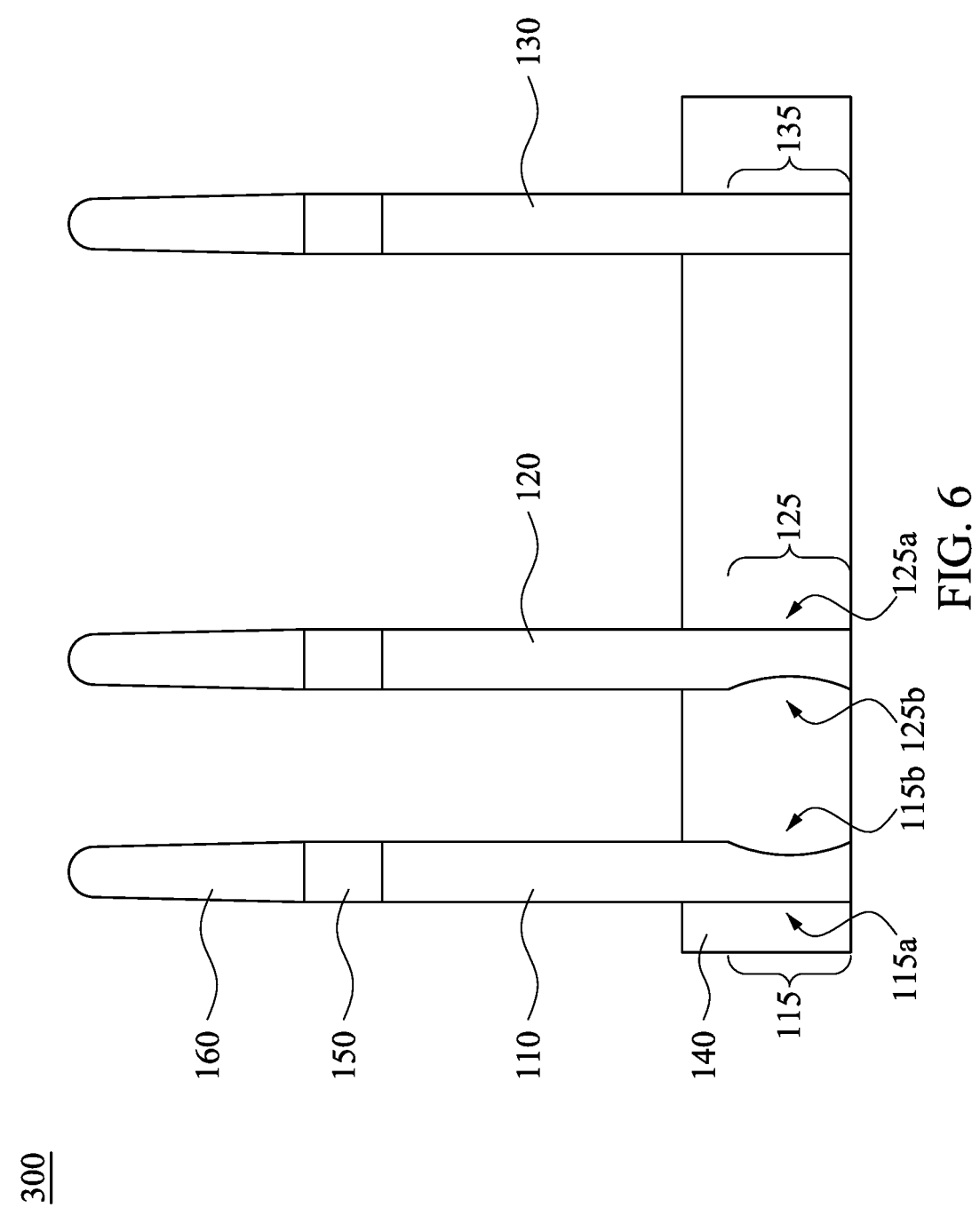
FIG. 6 is a schematic diagram of a semiconductor structure 300, according to alternative embodiments of the present disclosure.

FIG. 6 is a schematic diagram of a semiconductor structure 300, according to alternative embodiments of the present disclosure. With respect to the embodiments of FIG. 1, like elements in FIG. 1 are designated with the same reference numbers for ease of understanding. For simplicity, some reference numbers shown in FIG. 1 are not shown in FIG. 6.

In some embodiments, compared to the embodiments of FIG. 1, each one of the foot portion 115 of the first gate 110 and the foot portion 125 of the second gate 120 has a cut. For illustration in FIG. 6, the side wall 115b of the first gate 110 is not parallel to the side wall 115a, and is not vertical with respect to the fin structure 140. The side wall 125b of the second gate 120 is not parallel to the side wall 125a, and is not vertical with respect to the fin structure 140. The foot portion 115 of the first gate 110, corresponding to the side wall 115b, has a cut facing the second gate 120. The foot portion 125 of the second gate 120, corresponding to the side wall 125b, has a cut facing the first gate 110.

Compared to the aforementioned process and operations, in alternative embodiments of forming the semiconductor structure 300 in FIG. 6, the operation S240 in FIG. 5 is performed to remove more of the foot portion 115 of the first gate 110 and the foot portion 125 of the second gate 120.

With the semiconductor structure 300 in FIG. 6, the foot portions of the gates would have better isolation for the semiconductor structure 300 in the dense region as discussed above, because the foot portions of the gates, including, for illustration, the first gate 110 and the second gate 120, in the dense region, are more spaced apart from each other, compared to those illustrated in FIG. 1.

In some embodiments, the semiconductor structure is disclosed that includes the fin structure and the plurality of gates. The plurality of gates disposed with respect to the fin structure and including the first gate, the second gate, and the third gate. The spacing between the first gate and the second gate is smaller than the spacing between the second gate and the third gate. The second gate is disposed between the first gate and the third gate. The foot portion of the first gate, facing the second gate, and the first foot portion of the second gate, facing the first gate, have no lateral extension. The second foot portion of the second gate, facing the third gate, and the foot portion of the third gate, facing the second gate, have no lateral extension and/or cut.

Also disclosed is the method that includes forming a protection layer, forming the first gate, forming the second gate, and forming the third gate. Forming the protection layer which covers side walls of the first gate, the second gate, and the third gate that are disposed with respect to the fin structure. The foot portion of the first gate, facing the second gate, and the first foot portion of the second gate, facing the first gate, are not covered by the protection layer. Forming the first gate, the second gate, and the third are performed after removing the protection layer. Forming the first gate having the foot portion that faces the second gate and is not laterally extended. Forming the second gate having the first foot portion that faces the first gate and is not laterally extended, and the second foot portion that faces the third gate and has the vertical side wall. Forming the third gate having the foot portion that faces the second gate and has the vertical side wall. The spacing between the first gate and the second gate is smaller than the spacing between the second gate and the third gate.

Also disclosed is the method that includes performing a directional deposition to form the protection layer on side walls of the first gate, the second gate, and the third gate that are disposed with respect to the fin structure. The spacing between the first gate and the second gate is smaller than the spacing between the second gate and the third gate. The method further includes etching the protection layer and foot portions facing each other of the first gate and the second gate, to form the first gate and the second gate having foot portions that face each other and have no lateral extension, and to form the second gate and the third gate having foot portions that face each other and have vertical side walls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin structure;
   a plurality of gates disposed with respect to the fin structure and comprising a first gate, a second gate, and a third gate, wherein the second gate is disposed between the first gate and the third gate, and a spacing between the first gate and the second gate is smaller than a spacing between the second gate and the third gate; and
   wherein a foot portion of the first gate has a concave sidewall facing the second gate.

2. The semiconductor structure of claim 1, wherein the second gate has a first foot portion facing the first gate and a second foot portion facing the third gate, and each one of the second foot portion of the second gate and a foot portion of the third gate has a vertical side wall.

3. The semiconductor structure of claim 1, wherein the second gate has a first foot portion facing the first gate and a second foot portion facing the third gate, and the foot portion of the first gate and the first foot portion of the second gate have vertical side walls.

4. The semiconductor structure of claim 1, wherein the second gate has a first foot portion facing the first gate and a second foot portion facing the third gate, and the foot portion of the first gate and the first foot portion of the second gate have cuts.

5. The semiconductor structure of claim 1, wherein the second gate has a first foot portion facing the first gate and a second foot portion facing the third gate, and the foot portion of the first gate has a cut facing the second gate, and the first foot portion of the second gate has a cut facing the first gate.

6. The semiconductor structure of claim 1, wherein
   the second gate has a first foot portion facing the first gate and a second foot portion facing the third gate,
   side walls of the foot portions of the first gate and the second gate, facing each other, are not vertical with respect to the fin structure, and
   side walls of the foot portions of the second gate and the third gate, facing each other, are vertical with respect to the fin structure.

7. The semiconductor structure of claim 1, wherein the spacing between the first gate and the second gate is smaller than approximately 40 nanometers, and the spacing between the second gate and the third gate is greater than approximately 60 nanometers.

8. A method, comprising:
   forming a protection layer which covers side walls of a first gate, a second gate, and a third gate that are disposed with respect to a fin structure, wherein a foot portion of the first gate, facing the second gate, and a first foot portion of the second gate, facing the first gate, are not covered by the protection layer; and
   after removing the protection layer,
   forming the first gate having the foot portion that faces the second gate and is not laterally extended,
   forming the second gate having the first foot portion that faces the first gate and is not laterally extended, and a second foot portion that faces the third gate and has a vertical side wall, and
   forming the third gate having a foot portion that faces the second gate and has a vertical side wall, wherein a spacing between the first gate and the second gate is smaller than a spacing between the second gate and the third gate.

9. The method of claim 8, wherein forming the protection layer comprises:

performing a directional deposition on the first gate, the second gate, and the third gate.

10. The method of claim 9, wherein performing the directional deposition comprises:
    performing an ion induced polymer deposition, an ion induced polysilicon oxidation, or an atomic layer deposition (ALD) with ion activation deposition.

11. The method of claim 8, further comprising:
    removing parts of the foot portion of the first gate and the first foot portion of the second gate.

12. The method of claim 11, wherein the parts of the foot portions are removed under a wet etching, gas etching, plasma etching, remote plasma etching, and/or isotropic etching process.

13. The method of claim 8, further comprising:
    by removing parts of the foot portion of the first gate and the first foot portion of the second gate,
    forming the first gate having the foot portion that faces the second gate and has a vertical side wall, and
    forming the second gate having the first foot portion that faces the first gate and has a vertical side wall.

14. The method of claim 8, further comprising:
    by removing parts of the foot portion of the first gate and the second foot portion of the second gate,
    forming the first gate having the foot portion that faces the second gate and has a cut, and
    forming the second gate having the second foot portion that faces the first gate and has a cut.

15. A method, comprising:
    performing a directional deposition to form a protection layer on side walls of a first gate, a second gate, and a third gate that are disposed with respect to a fin structure, wherein a spacing between the first gate and the second gate is smaller than a spacing between the second gate and the third gate; and
    etching the protection layer and foot portions facing each other of the first gate and the second gate, to form the first gate and the second gate having foot portions that face each other and have no lateral extension, and to form the second gate and the third gate having foot portions that face each other and have vertical side walls.

16. The method of claim 15, wherein performing the directional deposition comprises:
    performing an ion induced polymer deposition, an ion induced polysilicon oxidation, or an atomic layer deposition (ALD) with ion activation deposition.

17. The method of claim 15, wherein etching the foot portions facing each other of the first gate and the second gate comprises:
    removing parts of the foot portions facing each other of the first gate and the second gate, to form the foot portions facing each other of the first gate and the second gate that have vertical side walls.

18. The method of claim 15, wherein etching the foot portions facing each other of the first gate and the second gate comprises:
    removing parts of the foot portions facing each other of the first gate and the second gate, to form the foot portions facing each other of the first gate and the second gate that have cuts.

19. The method of claim 15, wherein etching the protection layer and etching the foot portions facing each other of the first gate and the second gate are performed in single one process or in sequential processes.

20. The method of claim 15, further comprising:
    performing no directional deposition to the foot portions facing each other of the first gate and the second gate.

* * * * *